United States Patent

[11] 3,617,817

[72] Inventors Fumimaro Kawakatsu
Koganei-shi;
Takahiko Ihochi, Kodaira-shi; Takahiro
Okabe, Hachioji-shi, all of Japan

[21] Appl. No. 887,681
[22] Filed Dec. 23, 1969
[45] Patented Nov. 2, 1971
[73] Assignee Hitachi, Ltd.
Tokyo, Japan
[32] Priority Dec. 25, 1968
[33] Japan
[31] 43/94538

[54] LAMINATED CERAMIC STRUCTURE FOR CONTAINING A SEMICONDUCTOR ELEMENT
8 Claims, 4 Drawing Figs.

[52] U.S. Cl. 317/234 R, 317/235 R, 317/234 G, 317/234 N, 317/234 E, 317/101, 174/52 R
[51] Int. Cl. H01l 5/00
[50] Field of Search 317/234, 233, 233.1, 235.4, 101; 174/52

[56] References Cited
UNITED STATES PATENTS

| | | | |
|---|---|---|---|
| 3,497,947 | 3/1970 | Ardezzene | 29/577 |
| 3,520,054 | 7/1970 | Pensack et al. | 29/627 |
| 3,496,634 | 2/1970 | Kurtz et al. | 29/624 |
| 3,480,836 | 11/1969 | Arenstein | 317/100 |

*Primary Examiner*—John W. Huckert
*Assistant Examiner*—B. Estrin
*Attorney*—Craig, Antonelli & Hill

ABSTRACT: A package having a bottom plate comprises by laminating at least two ceramic plates, in which a semiconductor substrate including an integrated circuit is fixed on the principal surface of said bottom plate and a conducting layer with low resistivity is extended between said ceramic plates, an operating current being supplied to said integrated circuit through the conducting layer, thus the ohmic loss is reduced at the time of supplying the operating current.

FIG. 1
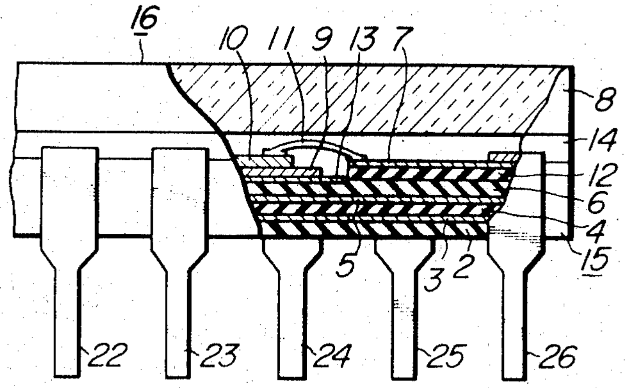
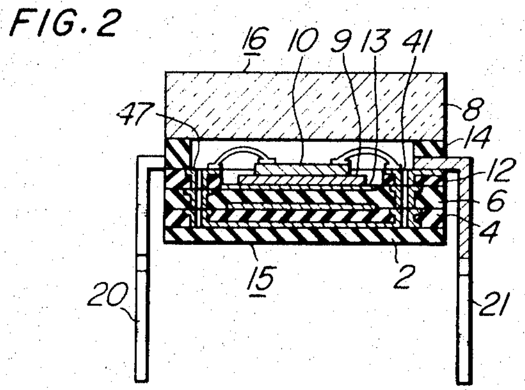
FIG. 4
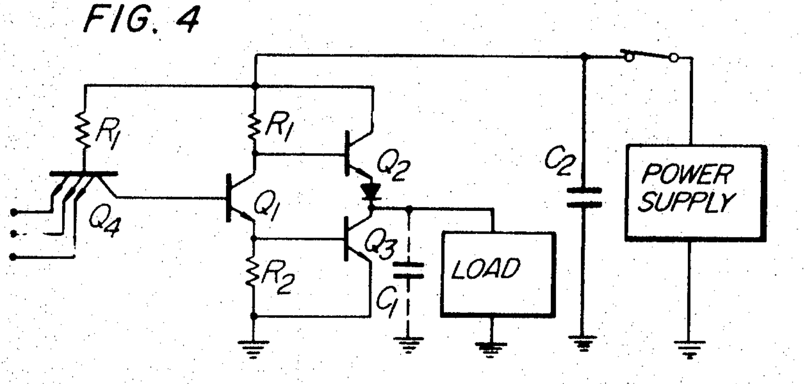
INVENTORS
FUMIMARO KAWAKATSU, TAKAHIKO IHOCHI
and TAKAHIRO OKABE
BY
Craig, Antonelli, Stewart & Hill
ATTORNEYS INVENTORS
FUMIMARO KAWAKATSU, TAKAHIKO IHOCHI
and TAKAHIRO OKABE
BY
Craig, Antonelli, Stewart & Hill
ATTORNEYS

LAMINATED CERAMIC STRUCTURE FOR CONTAINING A SEMICONDUCTOR ELEMENT

This invention relates to a vessel for containing a semiconductor element, particularly, a semiconductor integrated circuit.

A semiconductor element is generally enclosed in an airtight vessel, but it becomes more difficult to lead out many electrical paths with low resistivity from the element inside the vessel to the outside as the structure of the semiconductor element itself becomes more complex, for example, as in the case of an integrated circuit. That is, since such a type of package as a T0–5 which has been used for transistors in the past is unsuitable for enclosing an integrated circuit, the so-called flat package and dual-in-line type package have been proposed as suitable a packages for an integrated circuit.

Now, recently the tendency has become very pronounced for integrated circuits to be of larger scale, so that it is more and more essential to achieve a circuit arrangement that can perform a complicated function by freely using the crossing interconnection technique on the surface of a semiconductor substrate. When a semiconductor substrate on which a large scale integrated circuit is realized is enclosed in a conventionally proposed vessel, it is difficult to form lead out conducting paths of a wide width, since the circuit requires many such lead out conducting paths. However, the ohmic loss produced in a lead or current path for leading operation current is required to be made particularly small. In a conventional vessel a suitable alternative must be considered to allow the heat that is produced in a semiconductor substrate to be dissipated.

An object of the present invention is to reduce the electrical resistivity of an operation current supplying path to a semiconductor element in a package for a semiconductor element, particularly, an integrated circuit.

Another object of the present invention is to provide a package of which the heat dissipation function is increased.

Still another object of the present invention is to provide a package having a bottom plate comprised of laminated ceramics, in which a capacitor is contained in the bottom plate.

According to an embodiment of the present invention there is provided a package having a bottom plate comprised by piling up or laminated at least two ceramic plates, in which a semiconductor integrated circuit and a sealing means for enclosing the circuit are disposed on the principal surface of said bottom plate and the first metallized layer is extended between said ceramic plates, the operating electric power being supplied to said integrated circuit through the metallized layer which has a low electrical resistivity.

Further, a second metallized layer is formed on one of the surfaces of said ceramic plates, and the second metallized layer faces said first metallized layer interposing a ceramic plate adjacent to the second metallized layer, thereby forming a capacitor. When said integrated circuit is equivalently considered to include a spike current source from the viewpoint of electrical circuit network, the capacitor functions to decrease the power source impedance and to suppress the spike current.

It is effective to form such first and second metallized layers on one surface of and between ceramic plates for dissipating the heat generated in said semiconductor integrated circuit.

Other objects and features of the present invention will become more apparent from the following description of some preferred embodiments of the present invention in conjunction with the accompanying drawings, in which:

FIGS. 1 and 2 are partial sectional views of a package according to an embodiment of the present invention;

FIG. 4 is a diagram showing connection of the Transistor-Transistor Logic circuit provided with an Off Buffer circuit, which is to be integrated in one semiconductor substrate.

Figure 3:
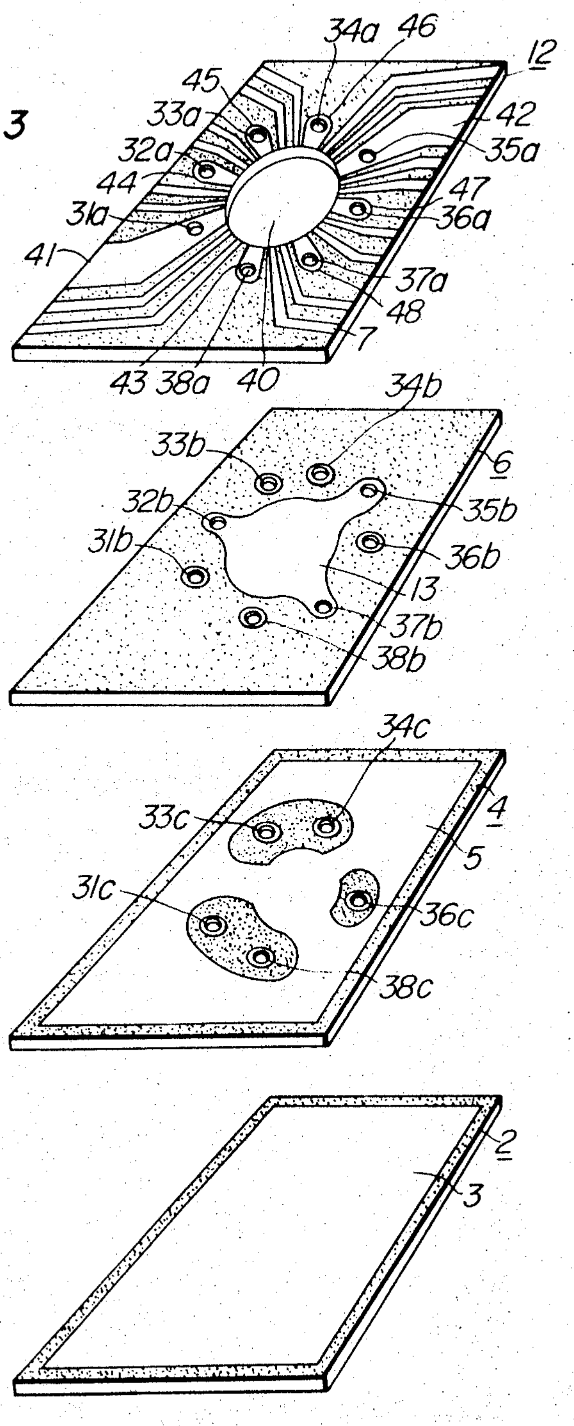
FIG. 3 is a perspective view showing four ceramic sheets for constructing a bottom plate of the package shown in FIGS. 1 and 2.

Referring to FIGS. 1 and 2, there is shown a ceramic package 16 having a bottom plate 15, a middle plate 14 fixed on the bottom plate and an upper plate, that is, a sealing plate 8 attached to the middle plate. The package having many leads 20–26 is suitable for containing, for example, a semiconductor integrated circuit as a semiconductor element 10. The bottom plate 15 has a recess and the element 10 is fixed to a metallized layer 13 formed in the recess interposing a thin plate 9 such as a molybdenum plate plated with gold. An electrode of the element 10 is connected to a conducting layer 7 on a surface of the bottom plate by means of a connecting wire 11 comprised of, for example, gold. This conducting layer 7 is connected to an outer lead 26. The aforementioned problem which arises at the electrode lead out place is mainly solved by means of the special construction of the bottom plate in the present invention.

The construction of the bottom plate is described in detail with reference to FIG. 3, in which the same portion as in FIGS. 1 and 2 are indicated by the same reference numerals. In this embodiment, the bottom plate 15 is comprised by four ceramic sheets 2, 4, 6 and 12 having a thickness of 0.05–1 mm. respectively. Most parts of the surface of the first ceramic sheet 2 are covered by a conducting layer 3. The second ceramic sheet 4 to be piled on the first sheet 2 has perforated holes **31*c*, 33*c*, 34*c*, 36*c* and 38*c* with, for example, 0.2 mm. in diameter having conducting layers formed on the inner wall of them and has a conducting layer 5 extending separately from the conducting layers in those holes. The third ceramic sheet 6 to be piled on the second sheet has holes 31*b*, 33*b*, 34*b*, 36*b* and 38*b* corresponding to the perforated holes provided in the second sheet, respectively, and perforated holes 32*b*, 35*b* and 37*b* which meet said conducting layer 5. A conducting layer 13 which short-circuits the perforated holes 32*b*, 35*b* and 37*b* is arranged. The surface of the third sheet 6 and receives the semiconductor element. The conducting layer 13 is connected to the conducting layer 5 with low resistivity through the inside of said perforated holes 32*b*, 35*b* and 37*b*. A relatively large hole 40, for example, 8–9 mm. in diameter is perforated at the center of the fourth ceramic sheet 12 to be piled on the third sheet and perforated holes 31*a*–38*a* corresponding to said perforated holes 31*b*–38*b* are formed around the hole. Many conducting layers are formed radially around the perforated hole 40. Conducting layers 41 and 42 and conducting layers 43–48 adhering to the inner wall of the holes 38*a*, 32*a*, 33*a*, 34*a*. 36*a* and 37*a* are formed in a wider width, for example, 0.5–1 mm. in width than a conducting layer for signal transmission represented by reference numeral 7 (this is, for example, is 0.1–0.3 mm. in width) in order to make the resistivity low. Incidentally, the conducting layers 3, 5 and 13 are clearly wider than the conducting layer 7** to make the resistivity lower.

When these four ceramic plates are piled up, a part of the wide conducting layer 41 is connected to the conducting layer 3 on the first sheet through conducting layers formed in the holes **31*a*, 31*b* and 31*c*. In the same way, conducting layers 45, 46, 47 and 43 contacting the perforated holes 33*a*, 34*a*, 36*a* and 38*a*, respectively, reach the conducting layer 3 through conducting layers in the holes 33*b*, 34*b*, 36*b* and 38*b*, and then conducting layers in the holes 33*c*, 34*c*, 36*c* and 38*c*, respectively. With the result that an electric current supplied to the conducting layer 41 flows firstly to the conducting layer 3 and is then led to the conducting layers 43, 45, 46 and 47 on the fourth ceramic sheet 12** through the conducting layers in said holes.

Another wide conducting layers 42 is electrically connected to the conducting layer 13 through a conducting layer in the hole **35*a* and the conducting layer 13 is connected to the conducting layer 5 on the second sheet 4 through conducting layers in the perforated holes 32*b*, 35*b* and 37*b*. Therefore, the conducting layers 42, 44 and 48 are short-circuited with each other via the conducting layer 13 and 5. In this case, the conducting layer 13 is not necessarily connected electrically to the conducting layers in the perforated holes 32*b*, 35*b*** and 37*b*. The bottom plate is manufactured by printing predetermined patterns on four green ceramic sheets i.c. an unsintered sheet provided by pressing a ceramic material such as $Al_2O_3$ including a volatile binder) by the use of Mo–Mn ink, piling up the sheets and sintering them in the piled-up or laminated state.

The thus constructed bottom plate has a recess encircled by the inner wall of the hole 40 perforated in the fourth sheet 12. A semiconductor integrated circuit substrate 10 is connected to the conducting layer 13 in the recess interposing the thin metal plate 9 as shown in FIGS. 1 and 2. In this case the metal thin plate 9 is met necessarily required. An input or output signal electrode of the integrated circuit is connected to the narrow conducting layer 7 for signal transmission, but a pair of power source terminals where the operation current flows are desirably connected to the wide conducting layers 41 and 42. In this case, the potential of the conducting layer 42 can be fixed to a reference potential such as earth potential.

A vessel for enclosing a semiconductor substrate in which the so-called large scale integration is realized is actually constructed to have a dimension of 25 mm.×22mm.×3 mm. and 40 outer lead wires according to the teaching of the present invention.

One advantageous point of the above described vessel is that it can decrease the resistance of the operation current path. That is, many electrodes for transmitting operation current can be formed on the integrated circuit substrate, since many power source paths (for example, conducting layers 41–48 shown in FIG. 3) can be arranged on the surface of the bottom plate, therefore, there becomes unnecessary to extend the power source paths or to carry out a complex crossover interconnection on the surface of the semiconductor substrate.

Another advantageous point is that the heat generated in the integrated circuit substrate is rapidly dissipated since the conducting layers 3, 5 and 13 are formed on the surface of the ceramic sheets 2, 4 and 6 having a thickness of 0.05–1 mm. The bottom plate also serves to increase the mechanical strength of the said package.

Moreover, when, for example, such a circuit as shown in FIG. 4 is embodied in a semiconductor substrate, the capacitor constructed in the bottom plate of the vessel can be advantageously utilized as the capacitor $C_2$ which is connected parallel to the power supply in order to decrease the power supply impedance. That is, in the package a capacitance nearly equal to a capacitance measured between the conducting layers 3 and 5 is measured between the conducting layers 41 and 42. Therefore, when a positive potential is applied to the conducting layer 41 and a predetermined negative potential is applied to the conducting layer 42, the circuit shown in FIG. 4 is constructed and operates as follows. In the TTL circuit of FIG. 4 having the Off Buffer circuit, transistors $Q_2$ and $Q_3$ which receive signals having a phase difference of 180° ($\pi$) to each other from a transistor $Q_1$ switch usually in such way that one of them is in the on state the other is in the off state. In the said Off Buffer circuit, delivery and acceptance of charge to a stray capacity $C_l$ connected parallel to a load R is compulsorily carried out by the transistors $Q_2$ and $Q_3$, then the response speed of the TTL circuit is risen. However, transistors $Q_2$ and $Q_3$ sometimes take the same switching state simultaneously because of the relation of delay time. If both transistors $Q_2$ and $Q_3$ take the one-state simultaneously, an excessive spike current flows. The bad influence on the power supply due to this spike current can be avoided by a suitable capacitor connected between the bus-bars of the power source. If it is assumed that the spike current is a triangular wave with a peak value $I_p$=10 mA and a duration of $\pi$=5 nsec. and the power source voltage Vcc is 5 v., since a capacitance $C_1$ of a capacitor is required to absorb the spike current is calculated by a relation $C_1=Q/Vcc=\frac{1}{2}I_p\cdot\pi/Vcc$, the required capacitance $C_1$ becomes 5 pf. or more.

Now, it is known that a capacitance C of a parallel-plate condenser is given by the next relation according to the teaching of electrostatics.

$$C=\frac{\epsilon_0\epsilon_s A}{d}$$

where $\epsilon_0$: dielectric constant of free space, $\epsilon_s$: specific inductive capacity of a dielectric substance, A : effective area of an electrode plate, d : distance between electrode plates.

Therefore, it is easy for those skilled in the art to make a capacitor having a capacitance $C_1$=5 λf. or larger in said bottom plate according to the above relationship.

After all, according to the present invention a capacitor for absorbing a spike current can be formed in a package without connecting a discrete capacitor between bus bars of a power source outside the package.

Only a few embodiments have been described above by way of understanding the present invention. Those who are skilled in the art can connect the conducting layer 13 shown in FIG. 3 to the conducting layer 3 by adjusting the position of the perforated hole instead of connecting it to the conducting layer 5, thus the device can be used keeping the conducting layers 13 and 3 at earth potential as occasion demands. In this case, the conducting layer 5 is electrically shielded from outside since it is enclosed by the conducting layers 3 and 13 from both sides. Further, in this case, the conducting layer 13 can be formed in a wider area on the surface of the third ceramic sheet 6 without making it come into contact with the conducting layers in the perforated holes 31*b*, 33*b*, 34*b*, ∓*b* and 38*b*. By doing this the dissipation of heat is further promoted.

Moreover, it is clear that the use of the capacitor formed in the bottom plate is not limited to said use and it can be used for other purposes, and furthermore, other elements such as other a capacitor or resistor can be formed in the bottom plate.

We claim:

1. A vessel for containing a semiconductor element, comprising:

a first insulating plate having first and second principal surfaces facing each other and first and second perforated holes separated from each other;

a first conducting layer extending on said second principal surface;

a semiconductor element having a plurality of electrodes arranged on said first principal surface;

a sealing means arranged on said first principal surface, which forms an airtight space together with said first insulating plate for enclosing said element;

a plurality of lead wires extending from said airtight space to the outside;

means for electrically connecting an electrode of said element to a first portion of said first conducting layer through said first perforated hole; and means for electrically connecting a portion of one of said lead wires within said space to a second portion of said first conducting layer different from said first portion thereof through said second perforated hole, and further comprising a second insulating plate having first and second principal surfaces, the first of which is brought into intimate contact with said second principal surface of said first insulating plate, said second insulating plate being provided with third and fourth perforated holes which are not in conformity with said first and second perforated holes;

a second conducting layer extending on said second principal surface of said second insulating plate facing to said first principal surface thereof;

saifd first insulating plate having fifth and sixth perforated holes corresponding to said third and fourth perforated holes;

a portion of another one of said leads within said space being electrically connected to a portion of said second conducting layer through said fifth and third perforated holes; and another electrode of said element being electrically connected to other portions of said second conducting layer through said sixth and fourth perforated holes.

2. A vessel according to claim 1, wherein said first and second conducting layers are piled interposing said second insulating plate, thus forming a capacitor.

3. A vessel according to claim 1, wherein a power source is connected between said lead connected to said first conducting layer and said lead connected to said second conducting layer.

4. A vessel according to claim 1, wherein a third conducting layer is extended onto said first principal surface of said first insulating plate, the third conducting layer being electrically connected to one of said first and second conducting layers and said semiconductor element being placed on the third conducting layer.

5. A vessel according to claim 1, wherein a third insulating plate adheres closely to the whole surface of said second principal surface of said second insulating plate.

6. A vessel according to claim 5, wherein the first, second and third insulating plate are made of a ceramic material and said first and second conducting layer includes molybdenum and manganese.

7. An integrated circuit device including, a. a first ceramic sheet;

b. a second ceramic sheet piled on the first ceramic sheet and having first and second perforated holes;

c. a first conducting layer extending between said first and second ceramic sheets so as to form a bridge between the first and second perforated holes;

d. a third ceramic sheet piled on said second ceramic sheet and having third and fourth perforated holes corresponding to said first and second perforated holes and fifth and sixth perforated holes separated from the third and fourth perforated holes;

e. a second conducting layer extending between said second and third ceramic sheets so as to form a bridge between said fifth and sixth perforated holes;

f. a fourth ceramic sheet piled on said third ceramic sheet, having seventh, eighth, ninth and tenth perforated holes corresponding to said third, fourth, fifth and sixth perforated holes respectively and an eleventh perforated hole having a diameter larger than those of said seventh, eighth, ninth and tenth perforated holes;

g. third, fourth, fifth and sixth conducting layers formed on said fourth ceramic sheet adjacently to said seventh, eighth, ninth and tenth perforated holes respectively;

h. a plurality of conducting layers for signal transmission extending on said fourth ceramic sheet, the width of each conducting layer for signal transmission being smaller than those of said third, fourth, fifth and sixth conducting layers;

i. a semiconductor integrated circuit substrate having a plurality of electrodes, which is arranged on the surface of said third sheet exposed in said eleventh perforated hole, said electrodes including the first, second, third and fourth electrodes for supplying the operating electric power to the circuit;

j. means for electrically connecting said third, fourth, fifth and sixth conducting layers to said first, second, third and fourth electrodes, respectively;

k. means for electrically connecting said third conducting layer to one portion of said first conducting layer through said seventh, third and first perforated holes;

l. means for electrically connecting said fourth conducting layer to another portion of said first conducting layer through said eighth, fourth and second perforated holes;

m. means for electrically connecting said fifth conducting layer to one portion of said second conducting layer through said ninth and fifth perforated holes;

n. means for electrically connecting said sixth conducting layer to another portion of said second conducting layer through said tenth and sixth perforated holes;

o. a sealing means constituting an airtight space together with said fourth sheet for enclosing said substrate; and p. a plurality of outer leads extending from said space to the outside through said sealing means and being electrically connected to said third, fourth, fifth and sixth conducting layers and the conducting layers for signal transmission respectively.

8. A device according to claim 7, wherein a metallized layer is formed between said substrate and said third sheet and the metallized layer is electrically connected to one of said first and second conducting layers.

* * * * *